US007123070B2

(12) United States Patent
Wang

(10) Patent No.: US 7,123,070 B2
(45) Date of Patent: Oct. 17, 2006

(54) HIGH FREQUENCY GAIN AMPLIFIER WITH PHASE COMPENSATION CIRCUIT

(75) Inventor: Chao-Shiun Wang, Taoyuan (TW)

(73) Assignee: Industrial Technology Research Institute (ITRI), Hsingchu (TW)

( * ) Notice: Subject to any disclaimer, the term of this patent is extended or adjusted under 35 U.S.C. 154(b) by 56 days.

(21) Appl. No.: 10/853,597

(22) Filed: May 24, 2004

(65) Prior Publication Data

US 2005/0260966 A1 Nov. 24, 2005

(51) Int. Cl.
*H03K 3/00* (2006.01)
(52) U.S. Cl. .................................. 327/247; 455/205
(58) Field of Classification Search ............... 327/231, 327/233–235, 246, 247, 359; 455/205, 208, 455/209, 333
See application file for complete search history.

(56) References Cited

U.S. PATENT DOCUMENTS 5,379,457 A * 1/1995 Nguyen ...................... 455/323
6,026,286 A * 2/2000 Long .......................... 455/327

* cited by examiner

Primary Examiner—Kenneth B. Wells
(74) Attorney, Agent, or Firm—Philip K. Yu; East IP Group

(57) ABSTRACT

A gain amplifier with quadrature phase compensation circuit is disclosed. The gain amplifier for in-phase ("I") and quadrature ("Q") signals comprises a first resistive component having a first input node ("Node 1") and a first output node ("Node 5"), with the Node 1 coupled to the I+ differential signal, a second resistive component having a second input node ("Node 3") and a second output node ("Node 7"), with the Node 3 coupled to the Q+ signal, a third resistive component having a third input node ("Node 2") and a third output node ("Node 6"), with the Node 2 coupled to the I− signal, a fourth resistive component having a fourth input node ("Node 4") and a fourth output node ("Node 8"), with the Node 4 coupled to said Q− differential signal, a first reactive component connecting between the Node 1 and the Node 7, a second reactive component connecting between the Node 3 and the Node 6, a third reactive component connecting between the Node 2 and the Node 8, a fourth reactive component connecting between the Node 4 and the Node 5. Then phase-shifted I+ is generated at the Node 5, a phase-shifted Q+ is generated at the Node 7, a phase-shifted I− is generated at the Node 6 and a phase-shifted Q− is generated at the Node 8.

20 Claims, 4 Drawing Sheets understand# HIGH FREQUENCY GAIN AMPLIFIER WITH PHASE COMPENSATION CIRCUIT

RELATED APPLICATIONS

The present application is related to a pending U.S. application, entitled "Dual Band Transceiver Architecture For Wireless Application," filed on Nov. 17, 2003, Ser. No. 10/713,022, assigned to the current Assignee. The present application is also related to a pending U.S. application, entitled "A Self-Calibrating, Fast-Locking Frequency Synthesizer," filed on even date hereof, Ser. No. 10/853,596, also assigned to the current Assignee. The content of the Related Applications are incorporated herein as if fully set forth herein.

FIELD OF THE INVENTION

The present invention generally relates to digital communications systems and more particularly to a technique for the suppression of frequency leakage caused by I/Q mismatch in a wireless receiver.

ART BACKGROUND

In digital communications systems, especially today's highly integrated transceiver design, quadrature signals, commonly referred to as I/Q (In-phase/quadrature) signals, have been commonly used in a receiver or transmitter for up or down frequency conversion.

I/Q modulators and demodulators are widely used in digital communications systems. I/Q demodulators have been extensively discussed in the technical literature. See, for example, Behzad Razavi, "RF Microelectronics," Prentice Hall (1998) and John G. Proakis, "Digital Communications," McGraw-Hill (1995). Also, some U.S. patents have issued, related to the technology of I/Q modulation and demodulation: U.S. Pat. No. 5,974,306, entitled "Time-Share I/Q Mixer System With Distribution Switch Feeding In-Phase and Quadrature Polarity Inverters" to Hornak, et al.; U.S. Pat. No. 5,469,126, entitled "I/Q Modulator and I/Q Demodulator" to Murtojarvi; U.S. Pat. No. 6,560,449, entitled "Image-Rejection I/Q Demodulators" to Liu; U.S. Pat. No. 6,330,290, entitled "Digital I/Q Imbalance Compensation" to Glas. Examples of system applications that incorporate and standardize I/Q modulation and demodulation include the GSM (Global System for Mobile Communications), IS-136 (TDMA), IS-95 (CDMA), and IEEE 802.11 (wireless LAN). I/Q modulation and demodulation have also been proposed for use in the Bluetooth wireless communication systems.

As can be appreciated by those skilled in the art, the quadrature signals÷orthogonality directly affects the overall accuracy of digital signal's modulation and demodulation. It has thus been the goal of the transceiver designers to try to maintain sameness in amplitude and orthogonal in phase for the quadrature signals.

Conventionally, the solution has been to first take digital sampling of the signal, and then use powerful digital signal processing to calculate the error. The error is converted back to analog and fed back to the analog front end circuit ("AFE") to do error correction. While such a method may accurately find the error and provide satisfactory orthogonality, its architecture and circuitry tend to become too complex, since the design of the AFE must be compatible with the DSP. Also, the conventional method would require multiple digital-analog converters (DAC) and analog-digital converter (ADC), thus greatly increasing the area and power consumption of the transceiver.

Reference is to FIG. 1, where a simplified block diagram of the conventional wireless receiver incorporating an I/Q demodulator is illustrated. The receiver includes an antenna 100 that receives a transmitted RF signal. The signal received by the antenna 100 is applied to a band-pass filter BPF 105, which filters out-of-band RF signals and rejects signals at frequencies other than the frequency of the desired RF carrier. The output of the BPF 105 is applied to a low-noise amplifier LNA 110, where the level of the input RF signal is raised sufficiently to effectively drive the receiver's mixer circuitry. The output from the LNA 110 is applied to the receiver's mixer/demodulator block, where a digital, frequency-synthesized local oscillator (LO) 125 is incorporated. The mixer/demodulator block also includes a quadrature demodulator, which includes I demodulator 130 and Q demodulator 120. As is well understood by those skilled in the art, an in-phase version of the LO signal is delivered to the I demodulator 130, while a quadrature (90° phase shifted) version of the LO signal is delivered to the Q demodulator 120. The outputs of the mixers 120, 130, after applied to their respective channel selection filters (CSF) 150, 140 and ADC 170, 160, constitute the demodulated I and Q signals 175, 165, respectively.

As can be appreciated by those skilled in the art, mismatch in I and Q channels will introduce frequency crosstalk, thus degrading the signal-to-noise ratio (SNR). I/Q mismatch has become inevitable due to state-of-the art semiconductor device design and fabrication inability to achieve "perfect" matching between devices, even devices on the same die.

Therefore, it is desirable to provide a simple and yet effective solution to address the amplitude and phase effects. It is also desirable for the solution to be combined with the high-frequency gain amplifier without increasing too much chip area.

SUMMARY OF THE INVENTION

A gain amplifier with quadrature phase compensation circuit is disclosed. The gain amplifier for in-phase ("I") and quadrature ("Q") signals comprises a first resistive component having a first input node ("Node 1") and a first output node ("Node 5"), with the Node 1 coupled to the I+ differential signal, a second resistive component having a second input node ("Node 3") and a second output node ("Node 7"), with the Node 3 coupled to the Q+ signal, a third resistive component having a third input node ("Node 2") and a third output node ("Node 6"), with the Node 2 coupled to the I− signal, a fourth resistive component having a fourth input node ("Node 4") and a fourth output node ("Node 8"), with the Node 4 coupled to said Q− differential signal, a first reactive component connecting between the Node 1 and the Node 7, a second reactive component connecting between the Node 3 and the Node 6, a third reactive component connecting between the Node 2 and the Node 8, a fourth reactive component connecting between the Node 4 and the Node 5. Then phase-shifted I+ is generated at the Node 5, a phase-shifted Q+ is generated at the Node 7, a phase-shifted I− is generated at the Node 6 and a phase-shifted Q− is generated at the Node 8.

DETAILED DESCRIPTION OF THE DRAWINGS

A gain amplifier with quadrature phase compensation circuit is disclosed. In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as to avoid unnecessarily obscuring the present invention. While the present invention, in relation to its related applications, is generally described in the context of the 2.4 GHz and 5 GHz ISM bandwidth commonly used for Wi-Fi, it should be apparent to those skilled in the art that the present invention is not limited to only 802.11 a/b transceiver designs.

Figure 1:
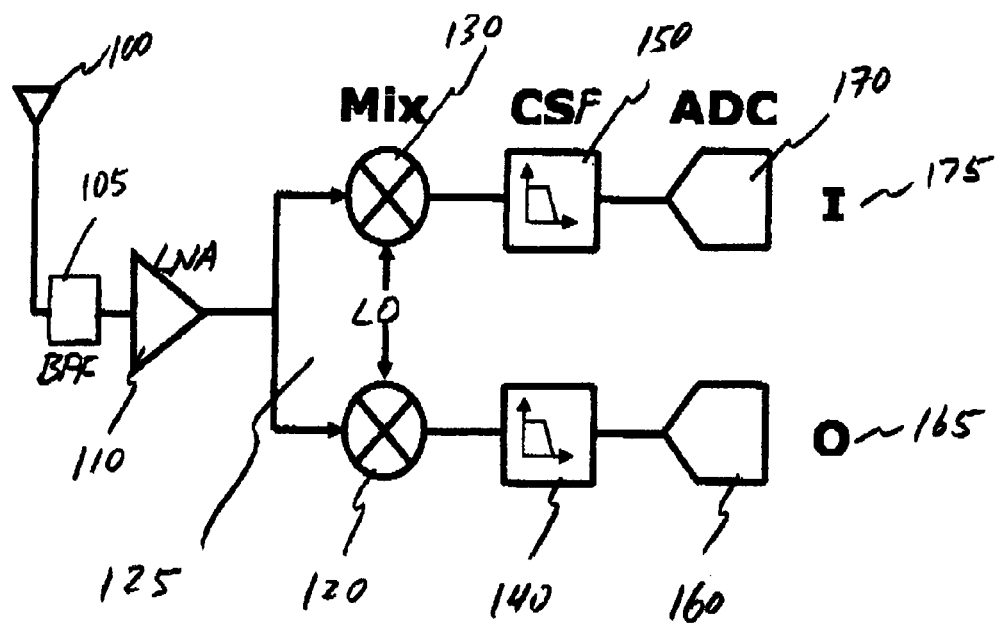
FIG. 1 is a simplified block diagram of a conventional wireless receiver incorporating an I/Q demodulator.
Figure 2:
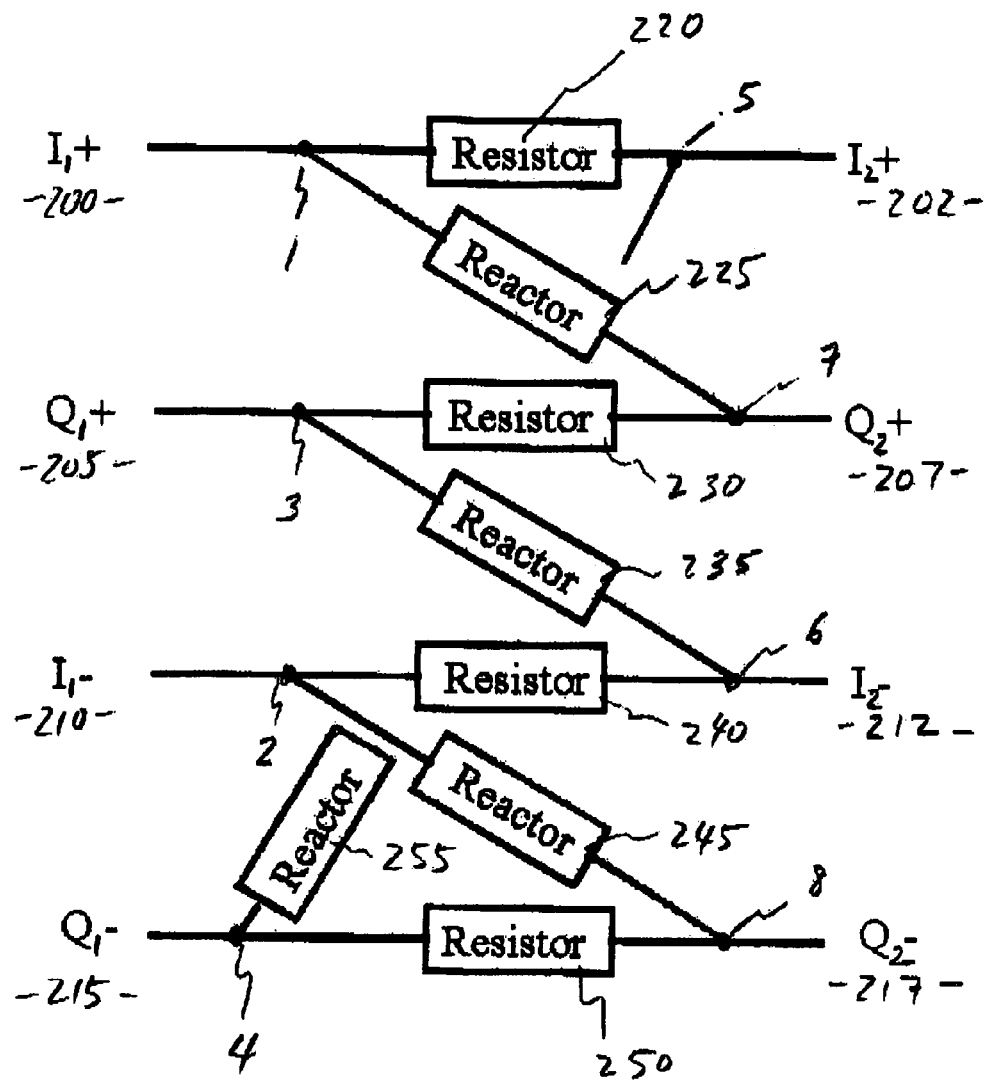
FIG. 2 illustrates a simplified block diagram of a phase compensator for quadrature signals in a highly integrated transceiver design.

Reference is to FIG. 2, where a simplified block diagram of a phase compensator for quadrature signals in a highly integrated transceiver design is illustrated. As illustrated in FIG. 2, quadrature signals I and Q are applied to a circuit formed by resistors and reactors so that the resulting quadrature signals can be phase-compensated. In FIG. 2, at the input side, the positive differential of the in-phase signal (I1+) 200 is applied to a resistor 220 and reactor 225 at a node 1. The positive differential of the quadrature signal (Q1+) 205 is applied to a resistor 230 and reactor 235 at a node 3. The negative differential of the in-phase signal (I1−) 210 is applied to a resistor 240 and reactor 245 at a node 2. The negative differential of the quadrature signal (Q1−) 215 is applied to a resistor 250 and reactor 255 at a node 4.

At the output side, I2+ 202 is obtained at a node 5 from a resistor 220 and reactor 216. Q2+ 207 is obtained at a node 7 from a resistor 230 and reactor 225. I2− 212 is obtained at a node 6 from a resistor 240 and reactor 235. Q2− 217 is obtained at a node 8 from a resistor 250 and reactor 245. As can be appreciated, the output signals, I2 and Q2, are phase-shifted from the input signals, I1 and Q1, because of the resistive and reactive network.

As can be appreciated by those skilled in the art, when a four-phase signal of an arbitrary phase is applied to the phase-compensation circuit, the four-phase signal of an arbitrary phase can be divided into a combination of signals of the same magnitude but with different phase. The phase compensation circuit as illustrated in FIG. 2 operates to pass clockwise sequences, while filtering out counter-clockwise sequences. As such, after I1+, I1−, Q1+, Q1− are applied through the simple, and yet effective, phase compensation network, only their clockwise sequences remain, while the counter-clockwise sequences are filtered out.

Based on simulation results, quadrature signals at 1.3 GHz with 10-degree phase error have been shown to be able to reduce the phase error to less than 2-degree, in a frequency range between 800 MHz and 1.7 GHz. For the quadrature signals around the 1.3 GHz frequency, the phase offset has been shown to be effectively minimized under certain ideal situations.

Figure 3:
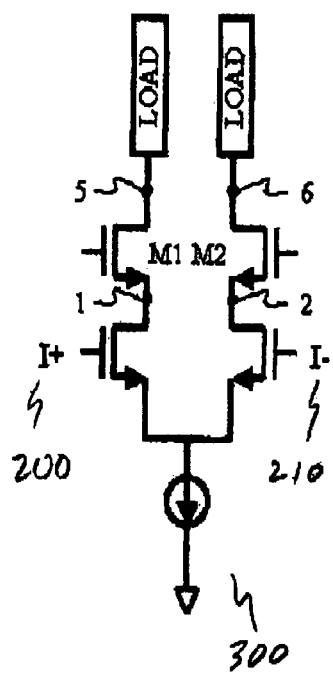
FIG. 3 illustrate the circuit diagram of the gain amplifier with phase compensation in accordance with the present invention.
Figure 3:
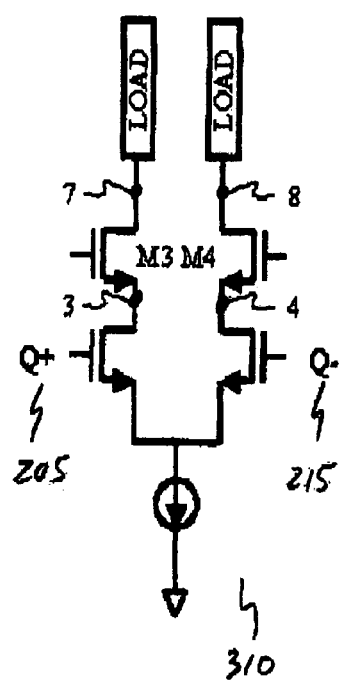
Figure 3:
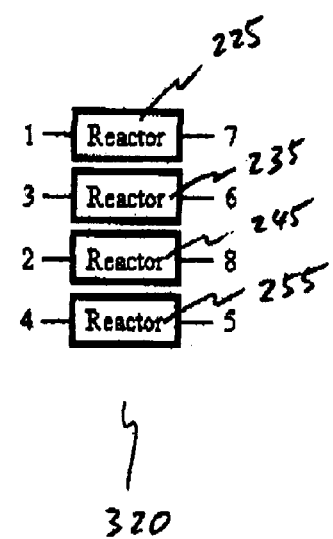

As can be appreciated, a phase compensation circuit thus disclosed, when combined with a gain amplifier, can provide both phase compensation and gain amplification around the operating frequency. The combined circuit does not increase additional real estate on the chip, nor does it increase too much power consumption. Such a circuit will now be described with reference to FIG. 3.

FIGS. 3(a)–(c) illustrate the circuit diagram of the gain amplifier with phase compensation in accordance with the present invention. It should be noted that the same reference numbers are used for the same components and signals. Referring to FIG. 3(a)–(c), I+ signal 200 is applied to the lower gate of the MOSFET M1, while I− signal 210 is applied to the lower gate of the MOSFET M2, where M1 and M2 are a common type of cascade differential amplifier. Q+ signal 205 is applied to the lower gate of the MOSFET M3, while Q− signal 215 is applied to the lower gate of the MOSFET M4, where M3 and M4 are a common type of cascade differential amplifier. The nodes 1 and 7, nodes 3 and 6, nodes 2 and 8, and nodes 4 and 5 are further connected through a reactor 225, 235, 245, 255, respectively.

The loads at the nodes 5, 6, 7 and 8 are dependent on the operating frequency, and can be either resistive or inductive component, where inductive components are particularly suited for high-frequency applications. Differential amplifiers M1–M2 and M3–M4 form an equivalent circuit of the four resistive components 220, 230, 240, 250, interconnected with four reactive components 225, 235, 245, 255, of the phase compensation circuit for the quadrature signals, as illustrated in FIG. 2. The reactive components 225, 235, 245, 255 may be either capacitive or inductor components, so that they act to provide a phase-shifting function.

Figure 4:
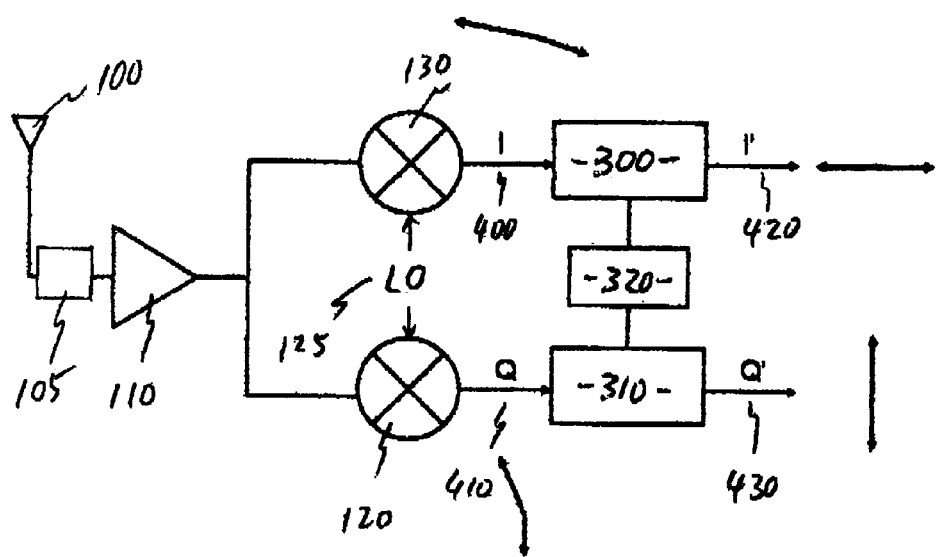
FIG. 4 illustrates a simplified block diagram of the wireless receiver incorporating the gain amplifier with phase compensation in accordance with the present invention.

FIG. 4 now illustrates a simplified block diagram of the wireless receiver incorporating the gain amplifier with phase compensation in accordance with the present invention. By applying the I signal 400 and Q signal 410 to the gain amplifier with phase compensation (300, 320, 330) after their respective mixer/demodulator 130, 120, a much orthogonal output signals I' 420 and Q' 430 are obtained.

Simulation results have shown that applying a quadrature signal at 3.7 GHz with a 10-degree phase error to the gain amplifier with phase compensation in accordance with the present invention was able to reduce the phase error down to less than 2-degree around 3 GHz and 5 GHz operating frequency. The result at around the 3.7 GHz operating frequency was even able to reach 0-degree, with gain of 0 dB, under certain ideal situations. Such performance benefits have been achieved without drastically increasing the area and power consumption of the receiver circuit.

Although the invention is described herein with reference to the preferred embodiment, one skilled in the art will readily appreciate that other applications may be substituted for those set forth herein without departing from the scope of the present invention. Accordingly, the invention should only be limited by the claims included below.

What is claimed is:

1. A phase compensator for in-phase (I) and quadrature (Q) signals for a communications receiver, said I signal having a positive (I+) and negative (I−) differential signals, said Q signal having a positive (Q+) and negative (Q−) differential signals, comprising:

a first resistive component having a first input node and a first output node, said first input node being coupled to said I+;

a second resistive component having a second input node and a second output node, said second input node being coupled to said Q+;

a third resistive component having a third input node and a third output node, said third input node being coupled to said I−;

a fourth resistive component having a fourth input node and a fourth output node, said fourth input node being coupled to said Q−;

a first reactive component connecting between said first input node and said second output node;

a second reactive component connecting between said second input node and said third output node;

a third reactive component connecting between said third input node and said fourth output node;

a fourth reactive component connecting between said fourth input node and said first output node, wherein a phase-shifted I+ is generated at said first output node, a phase-shifted Q+ is generated at said second output node, a phase-shifted I− is generated at said third output node and a phase-shifted Q− is generated at said fourth output node.

2. A phase compensator of claim 1, wherein:

said first, second, third and fourth resistive components are first, second, third and fourth MOSFET, respectively, and said first, second, third and fourth reactive components are first, second, third and fourth inductors, respectively.

3. A phase compensator of claim 1, wherein:

said first, second, third and fourth resistive components are first, second, third and fourth MOSFET, respectively, and said first, second, third and fourth reactive components are first, second, third and fourth capacitors, respectively.

4. A phase compensator of claim 2, wherein:

each of said first, second, third and fourth output nodes is further connected to a load element, which is either one of resistive and inductive component.

5. A phase compensator of claim 3, wherein:

each of said first, second, third and fourth output nodes is further connected to a load element, which is either one of resistive and inductive component.

6. A phase compensator of claim 4, wherein:

said I+ is connected to a gate of a 5th MOFET, which has one of its terminals connected to said first input node;

said I− is connected to a gate of a 6th MOSFET, which has one of its terminals connected to said third input node;

said Q+ is connected to a gate of a 7th MOSFET, which has one of its terminals connected to said second input node;

said Q− is connected to a gate of an 8th MOSFET, which has one of its terminals connected to said fourth input node.

7. A communication receiver, comprising:

a carrier signal source;

an in-phase ("I") demodulator having a first input terminal coupled to an output terminal of the carrier signal source and an output terminal generating an I signal, said I signal having a positive ("I+") and negative ("I−") differential signals;

a quadrature ("Q") demodulator having a first input terminal coupled to an output terminal of the carrier signal source and an output terminal generating a Q signal, said Q having a positive ("Q+") and negative ("Q−") differential signals;

a local oscillator (LO) signal source, supplying amplitude-controlled and phase-controlled LO signal to said I demodulator and said Q demodulator;

a first resistive component having a first input node and a first output node, said first input node being coupled to said I+;

a second resistive component having a second input node and a second output node, said second input node being coupled to said Q+;

a third resistive component having a third input node and a third output node, said third input node being coupled to said I−;

a fourth resistive component having a fourth input node and a fourth output node, said fourth input node being coupled to said Q−;

a first reactive component connecting between said first input node and said second output node;

a second reactive component connecting between said second input node and said third output node;

a third reactive component connecting between said third input node and said fourth output node;

a fourth reactive component connecting between said fourth input node and said first output node, wherein a phase-shifted I+ is generated at said first output node, a phase-shifted Q+ is generated at said second output node, a phase-shifted I− is generated at said third output node and a phase-shifted Q− is generated at said fourth output node.

8. A phase compensator of claim 7, wherein:

said first, second, third and fourth resistive components are first, second, third and fourth MOSFET, respectively, and said first, second, third and fourth reactive components are first, second, third and fourth inductors, respectively.

9. A phase compensator of claim 7, wherein:

said first, second, third and fourth resistive components are first, second, third and fourth MOSFET, respectively, and said first, second, third and fourth reactive components are first, second, third and fourth capacitors, respectively.

10. A phase compensator of claim 8, wherein:

each of said first, second, third and fourth output nodes is further connected to a load element, which is either one of resistive and inductive component.

11. A phase compensator of claim 9, wherein:

each of said first, second, third and fourth output nodes is further connected to a load element, which is either one of resistive and inductive component.

12. A phase compensator of claim 11, wherein:

said I+ is connected to a gate of a 5th MOFET, which has one of its terminals connected to said first input node;

said I− is connected to a gate of a 6th MOSFET, which has one of its terminals connected to said third input node;

said Q+ is connected to a gate of a 7th MOSFET, which has one of its terminals connected to said second input node;

said Q− is connected to a gate of an 8th MOSFET, which has one of its terminals connected to said fourth input node.

13. A phase compensation circuit for in-phase (I) and quadrature (Q) signals of a communications receiver, said I signal having a positive (I+) and negative (I−) differential signals, said Q signal having a positive (Q+) and negative (Q−) differential signals, said phase compensation circuit comprising:

a first cascade differential amplifier, said first cascade differential amplifier comprising:

a first MOSFET, having a first and second terminals and a gate terminal, said first terminal being coupled to a first output node and said second terminal being
coupled to a first input node;
a second MOSFET, having a first and second terminals
and a gate terminals, said gate terminal being connected said I+, said first terminal being coupled to
said first input node and said second terminal being
coupled to a predetermined voltage source;
a 1st load, coupled to said first output node;
a third MOSFET, having a first and second terminals
and a gate terminal, said first terminal being coupled
to a third output node and said second terminal being
coupled to a third input node;
a fourth MOSFET, having a first and second terminals
and a gate terminals, said gate terminal being connected said I−, said first terminal being coupled to
said third input node and said second terminal being
coupled to said predetermined voltage source;
a 2nd load, coupled to said third output node;
a second cascade differential amplifier, said second cascade differential amplifier comprising:
a fifth MOSFET, having a first and second terminals
and a gate terminal, said first terminal being coupled
to a second output node and said second terminal
being coupled to a second input node;
a sixth MOSFET, having a first and second terminals
and a gate terminals, said gate terminal being connected said Q+, said first terminal being coupled to
said second input node and said second terminal
being coupled to said predetermined voltage source;
a 3rd load, coupled to said second output node;
a seventh MOSFET, having a first and second terminals
and a gate terminal, said first terminal being coupled
to a fourth output node and said second terminal
being coupled to a fourth input node;
an eighth MOSFET, having a first and second terminals
and a gate terminals, said gate terminal being connected said Q−, said first terminal being coupled to
said fourth input node and said second terminal
being coupled to said predetermined voltage source;
a 4th load, coupled to said fourth input node;
a first reactor, coupled between said first input node and
second output node;
a second reactor, coupled between said second input node
and third output node;
a third reactor, coupled between said third input node and
fourth output node;
a fourth reactor, coupled between said fourth input node
and first output node,
wherein a phase-shifted I+ is generated at said first output
node, a phase-shifted Q+ is generated at said second
output node, a phase-shifted I− is generated at said third
output node and a phase-shifted Q− is generated at said
fourth output node.

14. A phase compensator of claim 13, wherein:
each of said first, second, third and fourth loads is one of
resistive and inductive component.

15. A phase compensator of claim 13, wherein:
each of aid first, second, third and fourth reactors is one
of capacitive and inductive component.

16. A phase compensator of claim 14, wherein:
each of aid first, second, third and fourth reactors is one
of capacitive and inductive component.

17. A communication receiver, comprising:
a carrier signal source;
an in-phase ("I") demodulator having a first input terminal
coupled to an output terminal of the carrier signal
source and an output terminal generating an I signal,
said I signal having a positive ("I+") and negative
("I−") differential signals;
a quadrature ("Q") demodulator having a first input
terminal coupled to an output terminal of the carrier
signal source and an output terminal generating a Q
signal, said Q having a positive ("Q+") and negative
("Q−") differential signals;
a local oscillator (LO) signal source, supplying amplitude-controlled and phase-controlled LO signal to said
I demodulator and said Q demodulator;
a first cascade differential amplifier, said first cascade
differential amplifier comprising:
a first MOSFET, having a first and second terminals
and a gate terminal, said first terminal being coupled
to a first output node and said second terminal being
coupled to a first input node;
a second MOSFET, having a first and second terminals
and a gate terminals, said gate terminal being connected said I+ signal, said first terminal being
coupled to said first input node and said second
terminal being coupled to a predetermined voltage
source;
a 1st load, coupled to said first output node;
a third MOSFET, having a first and second terminals
and a gate terminal, said first terminal being coupled
to a third output node and said second terminal being
coupled to a third input node;
a fourth MOSFET, having a first and second terminals
and a gate terminals, said gate terminal being connected said I− signal, said first terminal being
coupled to said third input node and said second
terminal being coupled to said predetermined voltage source;
a 2nd load, coupled to said third output node;
a second cascade differential amplifier, said second cascade differential amplifier comprising:
a fifth MOSFET, having a first and second terminals
and a gate terminal, said first terminal being coupled
to a second output node and said second terminal
being coupled to a second input node;
a sixth MOSFET, having a first and second terminals
and a gate terminals, said gate terminal being connected said Q− signal, said first terminal being
coupled to said second input node and said second
terminal being coupled to said predetermined voltage source;
a 3rd load, coupled to said second output node;
a seventh MOSFET, having a first and second terminals
and a gate terminal, said first terminal being coupled
to a fourth output node and said second terminal
being coupled to a fourth input node;
an eighth MOSFET, having a first and second terminals
and a gate terminals, said gate terminal being connected said Q− signal, said first terminal being
coupled to said fourth input node and said second
terminal being coupled to said predetermined voltage source;
a 4th load, coupled to said fourth input node;
a first reactor, coupled between said first input node and
second output node;
a second reactor, coupled between said second input node
and third output node;
a third reactor, coupled between said third input node and
fourth output node;
a fourth reactor, coupled between said fourth input node
and first output node, wherein a phase-shifted I+ is generated at said first output node, a phase-shifted Q+ is generated at said second output node, a phase-shifted I− is generated at said third output node and a phase-shifted Q− is generated at said fourth output node.

18. A phase compensator of claim 17, wherein:
each of said first, second, third and fourth loads is one of resistive and inductive component.

19. A phase compensator of claim 18, wherein:
each of aid first, second, third and fourth reactors is one of capacitive and inductive component.

20. A phase compensator of claim 16, wherein:
each of aid first, second, third and fourth reactors is one of capacitive and inductive component.

* * * * *